United States Patent [19]

Plies

[11] Patent Number: 4,507,559
[45] Date of Patent: Mar. 26, 1985

[54] DEFLECTION STRUCTURE FOR A CORPUSCULAR BEAM BLANKING SYSTEM AND METHOD FOR OPERATING SAME

[75] Inventor: Erich Plies, Munich, Fed. Rep. of Germany

[73] Assignee: Siemens Aktiengesellschaft, Berlin & Munich, Fed. Rep. of Germany

[21] Appl. No.: 499,482

[22] Filed: May 31, 1983

[30] Foreign Application Priority Data

Jul. 22, 1982 [DE] Fed. Rep. of Germany ....... 3227426

[51] Int. Cl.³ .......................... G21K 1/08; H01J 3/14
[52] U.S. Cl. ............................................... 250/396 R
[58] Field of Search ................... 250/310, 396 R, 398; 313/361.1; 328/229

[56] References Cited

U.S. PATENT DOCUMENTS

| | | | |
|---|---|---|---|
| 3,676,693 | 7/1972 | Guernet | 250/396 R |
| 4,063,091 | 12/1917 | Gee | 250/310 |
| 4,169,229 | 9/1979 | Feuerbaum | 250/396 R |
| 4,220,854 | 9/1980 | Feuerbaum | 250/310 |
| 4,220,855 | 9/1980 | Feuerbaum et al. | 250/310 |
| 4,223,220 | 9/1980 | Feuerbaum | 250/310 |
| 4,413,181 | 11/1983 | Feuerbaum | 250/310 |
| 4,434,371 | 2/1984 | Knaver | 250/396 R |
| 4,439,685 | 3/1984 | Plies | 250/396 R |

FOREIGN PATENT DOCUMENTS

3036660 5/1982 Fed. Rep. of Germany .

OTHER PUBLICATIONS

"A Modified Cylindrical Condenser As Electrostatic Prism", Liebl, *Int. Jour. of Mass Spectrometry and Ion Physics*, 22, (1976), pp. 203–207.
"Beam Chopper for Subnanosecond Pulses in Scanning Electron Microscopy", H. P. Feuerbaum et al., J. Phys. E.: Sci. Instrum., vol. 11, 1978, pp. 529–532.

*Primary Examiner*—Bruce C. Anderson
*Attorney, Agent, or Firm*—Hill, Van Santen, Steadman & Simpson

[57] ABSTRACT

A deflection structure for a corpuscular beam blanking system has two deflection electrodes, a first of which is supplied with a chronologically varying potential, the second of which being connected to a chronologically constant potential for generating standard corpuscular beam pulses. The structure further includes auxiliary electrodes disposed in front of and behind the deflection electrodes in the direction of beam travel for reducing the energy spread of the corpuscular beam, the auxiliary electrodes being supplied with a static voltage.

7 Claims, 8 Drawing Figures

DEFLECTION STRUCTURE FOR A CORPUSCULAR BEAM BLANKING SYSTEM AND METHOD FOR OPERATING SAME

BACKGROUND OF THE INVENTION

1. Field of the Invention

The present invention relates to deflection structures for corpuscular beam blanking systems and methods for operating such devices, and in particular to such a deflection structure having two deflection electrodes.

2. Description of the Prior Art

High frequency cut-in and cut-out of an electron beam is required, for example, for stroboscopic electron beam mensuration technology. A deflector capacitor is conventionally employed for beam blanking in electron beam mensuration technology. Such a deflection system is described, for example, in the article "Beam Chopper For Subnanosecond Pulses in Scanning Electron Microscopy," H. P. Feuerbaum et al, J. Phws. E: Sci. Instrum., Volume 11, 1978, pages 529–532. The two deflector plates of the deflector capacitor are conventionally charged simultaneously with pulses, the voltages at the two deflector plates exhibiting opposite operational signs. A pulse generator having two outputs, namely a "+" and a "−" output is required for such a so-called symmetrical circuit for the two deflector plates of the deflector capacitor.

It is technically simpler and more economical to construct a fast pulse generator with only one output, and thus to charge only a single deflector plate of the deflector capacitor with voltage pulses. The second deflector plate in such devices must be then supplied with a chronologically constant voltage. This is conventionally achieved by grounding the second deflector plate. Deflection structures having such a so-called asymmetrical wiring of the deflector capacitor are described, for example, in German patent application No. P3036660.0. Such asymmetrical wiring of the deflector capacitor, wherein one deflector plate is supplied with a chronologically constant potential, effects an energy spread of the corpuscular beam through the pulse deflector field which is higher than in systems employing symmetrical wiring. Such a higher energy spread of the corpuscular beam causes an enlargement of the diameter of the corpuscular beam probe due to the axial color aberration of the lenses which are disposed in the corpuscular beam direction after the corpuscular beam blanking system. The differential transit time effects also increase in direct proportion with an increase in the energy spread of the corpuscular beam, these effects causing a chronological "smear" of the corpuscular pulse in its path to the target. For these reasons, asymmetrical wiring of the deflector capacitor is not practical for obtaining accurate mensuration results.

SUMMARY OF THE INVENTION

It is an object of the present invention to provide a deflection structure having two deflection electrodes for a corpuscular beam blanking system and a method for operating this structure which is energized utilizing asymmetrical wiring without the beam energy spread normally associated therewith. The above object is inventively achieved in a deflection structure having a first deflection electrode supplied with a chronologically varying potential disposed opposite a second deflection electrode supplied with a chronologically constant potential, and having auxiliary electrodes for reducing the energy spread of the corpuscular beam disposed in front of and behind (at the input and at the output) of the deflection structure viewed in the direction of corpuscular beam travel, the auxiliary electrodes being supplied with a static voltage.

In a further embodiment of the invention the auxiliary electrodes may be supplied with a voltage which is approximately one-half the mean value of the peak pulse voltage which is supplied to the first deflection electrode. The auxiliary electrodes may be in the form of slit diaphragms or pinhole diaphragms.

In another embodiment, additional grounded electrodes may be provided for limiting the expanse of the static auxiliary fields.

In a further embodiment of the invention, the auxiliary electrodes may be angled with respect to the direction of beam travel.

The cylindrical or round lens fields produced by the auxiliary electrodes may be compensated by means of a stigmator and by means of changing the focusing of the built-in round lenses of the corpuscular-optical arrangement.

DESCRIPTION OF THE PREFERRED EMBODIMENTS

The embodiments disclosed herein are discussed below in the context of an electron beam blanking system, however, it will be understood that the subject matter disclosed and claimed herein is not restricted solely to use in electron beam blanking system, but can be applied to any corpuscular beam blanking system. Because the blanking field of an electron beam blanking system is chronologically variable, the total energy of an electron, viewed in the direction of beam travel, in front of the blanking field is not necessarily equal to the total energy of the electron after the blanking field, even if the electric potentials are identical in front of and after the blanking system, viewed in the beam direction. The electron may absorb energy in the electrical field of the blanking system or may emit energy. Given the explicitly time-dependent potential $\phi(r,t)$, $$\frac{dE_{ges}}{dt} = -e \frac{\partial \phi(\vec{r},t)}{\partial t} \quad (1)$$

is valid for the change in the total energy $E_{ges}$ of an electron having a charge $-e$ which is situated in the time-dependent potential $\phi(r,t)$. Equation (1) states that the total energy of the electron is constant only when the electrical potential $\phi$ does not explicitly depend upon time. In a chronologically variable external electric field $E(r,t)$ wherein $$E(r,t) = -\text{grad}\phi(r,t) \quad (1a)$$

the change in the kinetic energy $E_{kin}$ of the electron is:

$$\frac{dE_{kin}}{dt} = -e \, \vec{v}(\vec{r},t) \, \vec{E}(\vec{r},t), \quad (2)$$

wherein v is the velocity vector of the electron. Integration over time t of equation (2) results in the change of the kinetic energy of the electron, and thus the energy spread of the electron beam due to the pulsed deflection field upon traversal through the blanking system can be expressed as follows:

$$\Delta E_{kin} = E_{kin,end} - E_{kin,start} = -e \int_{t_{start}}^{t_{end}} \vec{v}(\vec{r}(t),t) \vec{E}(\vec{r}(t),t) dt \quad (3)$$

wherein $T_{end} - t_{start}$ is the "influencing time" of the blanking field of the blanking system on an electron of the electron beam. The influencing time generally differs for different electrons in the electron beam depending upon the point in time at which a particular electron passes the deflection system between the cut-in and cut-out points in time of the electrical pulse which is applied to the deflection structure of the blanking system. The electron orbit r may be inserted in equation (3) for r(t), such that r=r(t).

Figure 1:
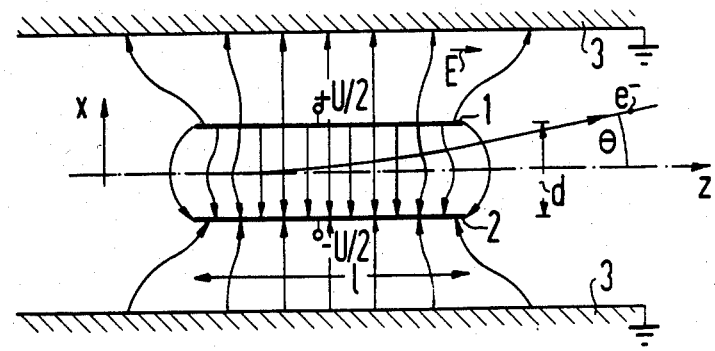
FIG. 1 is a side view showing electric field lines for a conventional deflection system employing symmetrical wiring of the deflection electrodes.
Figure 2:
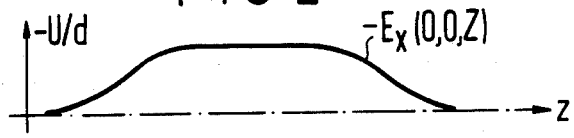
FIG. 2 is a diagram showing the field strength for the system shown in FIG. 1 along the optical axis.

A conventional symmetrical wiring system is shown in FIG. 1 together with the electric field lines produced thereby. Such a system has a deflection structure including deflection plates or electrodes 1 and 2. In such an asymmetrically wired system, a voltage $+U/2$ is supplied to deflection electrode 1, and a voltage $-U/2$ is supplied to the deflection electrode 2. A spacing d exists between the electrodes 1 and 2. The length of the deflection electrodes 1 and 2 in the beam direction is l. The beam direction, and thus the optical axis of the system, proceed in the z-direction of a Cartesian coordinate system. The x-direction and y-direction proceed perpendicular to the z-direction. The deflection electrodes 1 and 2 are disposed within a symmetrical grounded environment 3. The electrons of the electron beam passing through the blanking system exhibit a deflection angle $\theta$ as a result of the blanking field. The field strength along the optical axis for the structure shown in FIG. 1 is graphically represented in FIG. 2. Along the optical axis of the structure shown in FIG. 1, only the field strength $E_x = -U/d$ differs from zero, independently of whether the deflection electrodes 1 and 2 are detached from or adjacent to the symmetrical grounded environment 3. Because the optical axis coincides with the z-axis, the electrical field strength $E_x$ along the optical axis exhibits only a z-dependency.

Figure 3:
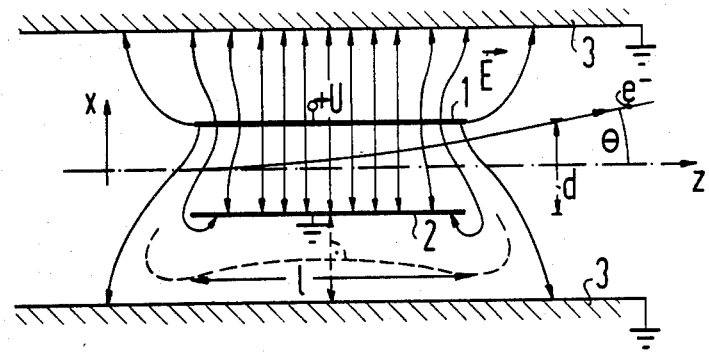
FIG. 3 is a side view of a conventional deflection system employing asymmetrical wiring showing the electrical field lines.

A conventional deflection system utilizing asymmetrical wiring is shown in FIG. 3, which also represents the electrical field lines. This structure also includes deflection electrodes 1 and 2 in a grounded environment 3. In this type of system, however, the deflection electrode 1 is supplied with a voltage $+U$, and the deflection electrode 2 is grounded. The remaining reference numerals coincide with the designations already described in connection with FIG. 1. A grounded environment 3 always exists in an electron/optical column. As can be seen from FIG. 3, the edge field of the plate capacitor consisting of the deflection electrodes 1 and 2 also has a z-component of the electric field, $E_z$, along the optical axis which differs from zero.

Figure 4:
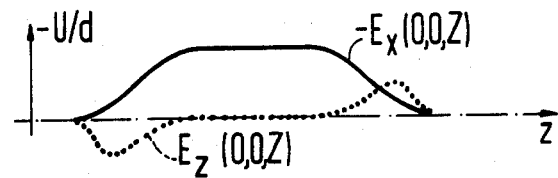
FIG. 4 is a graphical representation of the field strength for the system shown in FIG. 3 along the optical axis.

The field strength E along the optical axis for the structure shown in FIG. 3 is graphically represented in FIG. 4. The $E_x$ component of the electrical field along the optical axis exhibits approximately the same behavior as that discussed above for symmetrical wiring of the deflection electrodes 1 and 2. The $E_z$ component of the electric field in the asymmetrical wiring arrangement differs from zero in contrast to the symmetrical wiring structure shown in FIG. 1.

The component $E_y$ of the field strength in the deflector plate capacitor is equal to zero in the deflection section (x-z plane) given either symmetrical or asymmetrical wiring of the deflection electrodes 1 and 2. Equation (3) is thus reduced to:

$$\Delta E_{kin} = -e \int_{t_{start}}^{t_{end}} \{v_x(\vec{r},t)E_x(\vec{r},t) + v_z(\vec{r},t)E_z(\vec{r},t)\} \quad (4)$$

As a result of the beam blanking field E the deflection angle $\theta$ is of the order of the beam aperture $\alpha$ in the blanking system. In the commercially available blanking system for the electron beam device Cambridge S150, for example, the beam aperture $\alpha$ is $10^{-2}$ rad. Because of the relationship:

$$\frac{v_x}{v_z} \leq \left(\frac{v_x}{v_z}\right)_{end} = \theta \approx \alpha \ll 1$$

the first addend in equation (4) can be ignored. Because $v_z = dz/dt$, the following relationship is present:

$$\Delta E_{kin} \simeq -e \int_{t_{start}}^{t_{end}} v_z E_z dt = -e \int_{z_{start}}^{z_{end}} \vec{E}_z(\vec{r},t) \, dz \quad (5)$$

The z-component of the electrical field E in the deflection section (x-z plane), that is $E_z(r,t) = E_z(x,o,z,t)$, can be approximated by a truncated Taylor series around the x-dependency. Given the additional assumption that electrical curl fields induced as a result of the chronologically variable electrical blanking field E can be ignored, the curve of the component $E_x$ of the electrical blanking field E can be introduced into the second term of the series expansion for the component $E_z$ of the electrical blanking field E as follows:

$$E_z \simeq E_z\big|_{x=o} + \frac{\partial E_x}{\partial z}\bigg|_{x=o} \cdot x \quad (6)$$

For symmetrical wiring of the deflection electrodes 1 and 2 as shown in FIG. 1, the component $E_z|_{x=o} = 0$, the energy spread for the electron beam can be derived from equations (5) and (6) as the following expression $$\Delta E_{kin} \simeq -e \int_{z_{start}}^{z_{end}} \frac{\partial E_x}{\partial z}\bigg|_{x=o} \cdot x \, dz \quad (7)$$

At the input edge field of the plate capacitor of the blanking system, $x \simeq 0$, so that only the output edge field of the plate capacitor of the blanking system contributes to the energy spread. That electron of the electron beam which traverses precisely the entire output edge field of the plate capacitor of the output system during the duration $\tau_p$ of the peak pulse (see FIG. 6) experiences the maximum kinetic energy change. The value of this maximum energy change depends weakly on the specific edge field drop of the respective plate capacitor. The maximum value for the energy change of equation (7) may, however, be roughly estimated with the mean value set of the integral calculation:

$$\Delta E_{kin}|_{max} \simeq -e \frac{U/d}{d} \cdot \frac{1}{2} \theta d = -e \frac{Ul}{2d} \theta. \quad (8)$$

The voltage between the two deflection electrodes 1 and 2 of the plate capacitor of the blanking system, given a supplied peak pulse of the blanking signal is referenced U. The minus sign in equation (8) denotes a retardation of the electron, which can easily be seen on the basis of FIG. 1. If, in equation (8), the pulse peak U is ten volts, the ratio l/d is 10, and the deflection angle $\theta$ is $2 \cdot 10^{-2}$ rad, the maximum energy change $E_{kin}|_{max} \simeq -1$ eV.

For asymmetrical wiring of the deflection electrodes 1 and 2 of the plate capacitor of the blanking system according to FIG. 3, the z-component $E_z$ of the electrical field strength E along the optical axis is no longer zero, that is, $$E_z|_{x=o} \neq 0.$$

The second addend can then be ignored in equation (6), with the Taylor series expansion and equations (5) and (6) producing the approximation:

$$\Delta E_{kin} \simeq -e \int_{z_{start}}^{z_{end}} E_z|_{x=o} \, dz \quad (9)$$

Because, as shown in FIGS. 3 and 4 the field component $E_z|_{x=o}$ has opposite operational signs at the input edge field and at the output edge field of the plate capacitor of the blanking system, the kinetic energy change according to equation (9) becomes zero for an electron which traverses both edge fields of the plate capacitor during a cut-in pulse. (Because the second term in equation (6) has been ignored in deriving equation (9), the energy change of such an electron as traverses both edge fields of the plate capacitor given a cut-in pulse is more precisely stated to remain as large as that which would occur in the symmetrical wiring arrangement shown in FIG. 1.) An electron which only traverses the input edge field during a cut-in pulse is maximally accelerated given asymmetrical wiring of the plate capacitor, whereas an electron which only traverses the entire output edge field of the plate capacitor given a cut-in pulse is maximally delayed by the same energy amount. The curve for $E_z|_{x=o}$ along the optical axis substantially depends upon the distance and the shape of the grounded environment 3. It can be assumed for a rough estimation of the path of the component $E_z$ along the optical axis that the electrical field E in the edge field of the plate capacitor intersects the z-axis at approximately 60° and that the component $E_z$ exhibits the approximated value $U \cdot \cos 60°/d$ over an effective length d along the optical axis. Equation (9) can then be utilized to derive the maximum energy change for such an electron as follows:

$$\Delta E_{kin}|_{max} \simeq \pm e \frac{U}{2} \simeq \pm 5 \text{ eV for } U = 10 \text{ V}.$$

This means that the energy spread for the electron beam given asymmetrical wiring of the deflection electrodes 1 and 2 of the deflection system is approximately one order greater given the assumptions made, than in the symmetrical wiring of the deflection electrodes 1 and 2 of the blanking system shown in FIG. 1.

Figure 5:
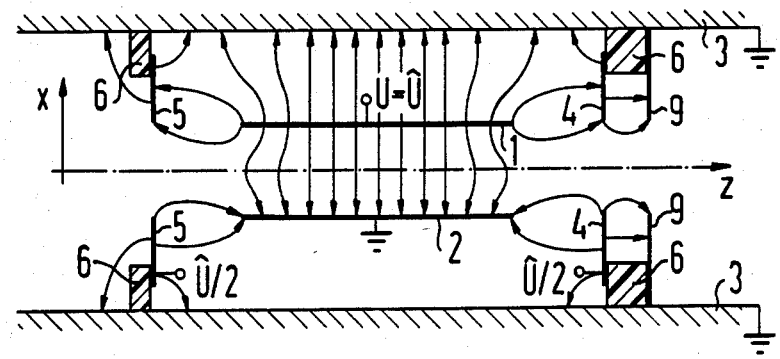
FIG. 5 is a side view showing electrical field lines for a deflection system constructed in accordance with the principles of the present invention employing asymmetrical wiring with auxiliary electrodes.
Figure 6:
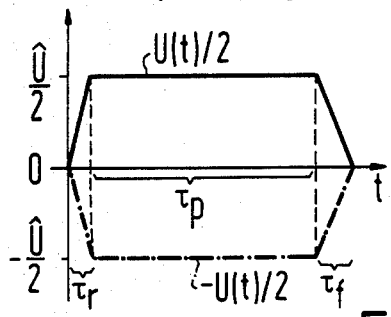
FIG. 6 is a voltage/time diagram showing idealized voltage pulses for symmetrical wiring of the deflection electrodes of a deflector capacitor.

A deflection system constructed in accordance with the principles of the present invention is shown in FIG. 5 having asymmetrically wired deflection electrodes 1 and 2 and auxiliary electrodes 4 and 5. The electrical field lines for this arrangement are also illustrated in FIG. 5. The auxiliary electrodes 4 and 5, disposed at both edge fields of the plate capacitor of the blanking system formed by the electrodes 1 and 2 are supplied with the potential which is present at the optical axis in the interior of the plate capacitor, that is, U/2. This causes the field component $E_z$ to disappear along the optical axis, as is the case given symmetrical wiring in the conventional arrangement shown in FIG. 1. The auxiliary electrodes 4 and 5 may be slit or pinhole diaphragms, as shown at the left portion of FIG. 5. In order for the field component $E_z$ along the optical axis to always be zero, the auxiliary electrodes 4 and 5 should theoretically be supplied with the chronologically variable potential U(t)/2. It is sufficient, however, to supply the auxiliary electrodes 4 and 5 with a static voltage U/2, where U is the peak pulse voltage supplied to the deflection electrode 1. This is because, for a chronologically variable deflection field E, the appearance of the component $E_z$ along the optical axis occurs only during the pulse rise time $\tau_r$ and the pulse decay time $\tau_f$ of the electrical pulse U(t) applied to the deflection electrode 1. The pulse rise time and pulse decay time are, however, generally small in comparison to the pulse duration $\tau_p$, as illustrated in FIG. 6. If the pulse rise time $\tau_r$ and the pulse decay time $\tau_f$ are ignored in comparison to the much larger pulse duration $\tau_p$, the remaining energy spread of the electron beam reaches approximately the value for symmetrical wiring of the deflection electrode 1 and 2 of the blanking system.

It should be noted that at least weak static cylindrical lens fields are generated by the auxiliary electrodes 4 and 5 and, upon employment of dynamically balanced auxiliary electrodes 4 and 5, weak static round lens fields are also generated. The effects of these fields can be compensated by a static stigmator, already provided, and by changing the focusing of the built-in round lenses of the electron-optical column.

As shown at the right portion of FIG. 5, additional grounded electrodes 9 can be provided to further limit the expanse of the static auxiliary fields. The auxiliary electrodes 4 and 5 are each mounted to the grounded environment 3 by means of insulators 6. The grounded electrodes 9 may be disposed only at the auxiliary electrodes 5, or at both the auxiliary electrodes 4 and 5.

Idealized voltage pulses for symmetrical wiring of the deflection electrodes 1 and 2 of a conventional blanking system of the type shown in FIG. 1 are illustrated in FIG. 6. The pulse at the deflection electrode 1 rises linearly to the value U/2 during the rise time, retains this value U/2 during the pulse duration $\tau_p$, and linearly drops to the value zero during the pulse decay time $\tau_f$. A voltage pulse is simultaneously applied to the deflection electrode 2, this voltage pulse differing from the voltage point at the deflection electrode 1 only in that it exhibits an opposite operational sign.

Figure 7:
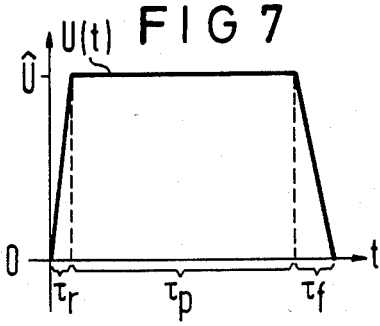
FIG. 7 is a voltage/time diagram showing an idealized voltage pulse for asymmetrical wiring of the deflection electrodes of a deflector capacitor.

An idealized voltage pulse for asymmetrical wiring of the deflection electrodes 1 and 2 of a conventional deflection structure of the type shown in FIG. 3 is illustrated in FIG. 7. Whereas the deflection electrode 2 is constantly grounded, a voltage U(t) is supplied to the deflection electrode 1, this rising linearly from zero to the value U during the pulse rise time $\tau_r$, remaining at the value U during the pulse duration $\tau_p$, and falling linearly to the value zero during the pulse decay time $\tau_f$.

Figure 8:
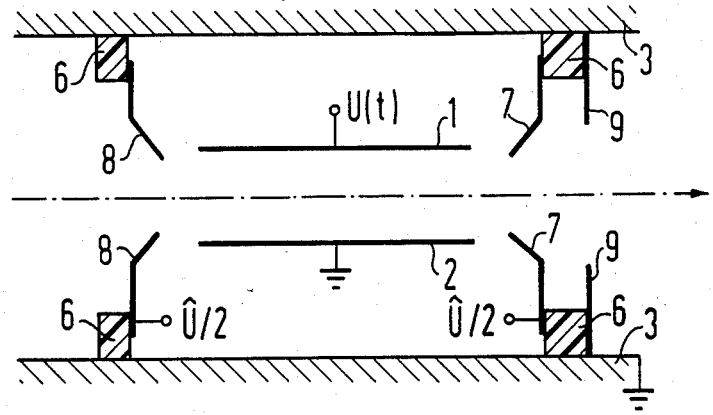
FIG. 8 is a side view of a deflection system constructed in accordance with the principles of the present invention employing angled auxiliary electrodes.

A further embodiment of the invention shown in FIG. 8 employing angled auxiliary electrodes 7 and 8 for reducing the energy spread given asymmetrical wiring of the deflection electrodes 1 and 2. In the embodiment shown in FIG. 8, the additional grounded electrodes 9 can be omitted, or may be respectively disposed only at the auxiliary electrodes 7 or only at the auxiliary electrodes 8, or may be disposed in proximity to both the auxiliary electrodes 7 and 8.

Proceeding in direction proportion with the reduction of the energy spread of the electron beam is a reduction in the differential transit time effects of the electrons, which oppose a chronological "smear" of the electron pulse. Given high frequency technical design of the beam blanking system, the presence of the auxiliary electrodes 4, 5, 7 and 8 must be taken into consideration so that no unwanted pulse reflections or other undesired effects arise.

By means of the auxiliary electrodes 4, 5, 7 or 8 at the input and output of the asymmetrically wired deflector capacitor of the blanking system, the higher energy spread normally occurring in conventional asymmetrically wired deflection systems is substantially reduced so as to approximate the lower energy spread associated with conventional systems employing symmetrical wiring of the deflection electrodes, without the need to employ an expensive pulse generator having both positive and negative outputs as is necessary for conventional systems of the type shown in FIG. 1.

Although modifications and changes may be suggested by those skilled in the art it is the intention of the inventor to embody within the patent warranted hereon all changes and modifications as reasonably and properly come within the scope of his contribution to the art.

I claim as my invention:

1. A deflection structure for a corpuscular beam blanking system comprising:
    first and second deflection electrodes disposed on opposite sides of said corpuscular beam, said first deflection electrode being supplied with a chronologically varying potential and said second deflection electrode being supplied with a chronologically constant potential to provide for an asymmetric wired deflection means; and
    a plurality of auxiliary electrodes respectively disposed at the input and at the output of said deflection electrodes viewed in the direction of corpuscular beam travel for reducing the energy spread of said corpuscular beam, said auxiliary electrodes being respectively supplied with a static voltage value.

2. A deflection structure as claimed in claim 1 wherein said first deflection electrode is supplied with a pulse and wherein said static voltage value is approximately one-half of the mean value of the peak of said pulse.

3. A deflection structure as claimed in claim 1 wherein said auxiliary electrodes are slit diaphragms.

4. A deflection structure as claimed in claim 1 wherein said auxiliary electrodes are pinhole diaphragms.

5. A deflection structure as claimed in claim 1 further comprising a plurality of additional grounded electrodes disposed adjacent to and insulated from at least one of said auxiliary electrodes for limiting the expanse of the static auxiliary fields generated by said auxiliary electrodes.

6. A deflection structure as claimed in claim 1 wherein said auxiliary electrodes are angled.

7. A method for operating an asymetric deflection structure for corpuscular beam blanking in a corpuscular-optical arrangement, said asymetric deflection structure having a pair of opposed deflection electrodes, one of said opposed electrodes being supplied with a varying potential and the other said opposed electrodes being supplied with a constant potential, and a plurality of auxiliary electrodes, said auxiliary electrodes generating electric fields corresponding to the types of electric fields generated by cylindrical lenses or round lenses, comprising the step of compensating for said fields generated by said auxiliary electrodes by utilizing a stigmator and by changing the focusing of built-in round lenses in said corpuscular-optical arrangement.

* * * * *